(12) United States Patent
Klenk et al.

(10) Patent No.: US 11,109,478 B2
(45) Date of Patent: Aug. 31, 2021

(54) SEMI-FLEXIBLE RIDGED PRINTED CIRCUIT BOARD ASSEMBLY

(71) Applicant: STEERING SOLUTIONS IP HOLDING CORPORATION, Saginaw, MI (US)

(72) Inventors: Daniel J. Klenk, Saginaw, MI (US); Delynn Streng, Freeland, MI (US); Ryan D. Yaklin, Lincoln, MI (US); John I. Chu, Saginaw, MI (US); Neal R. Roller, Essexville, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 146 days.

(21) Appl. No.: 16/190,426

(22) Filed: Nov. 14, 2018

(65) Prior Publication Data

US 2019/0150269 A1 May 16, 2019

Related U.S. Application Data

(60) Provisional application No. 62/586,470, filed on Nov. 15, 2017.

(51) Int. Cl.
*H05K 1/02* (2006.01)
*H02K 11/30* (2016.01)
*B62D 5/04* (2006.01)

(52) U.S. Cl.
CPC ........... *H05K 1/028* (2013.01); *B62D 5/0403* (2013.01); *B62D 5/0406* (2013.01); *H02K 11/30* (2016.01); *B62D 5/0409* (2013.01); *H05K 2201/056* (2013.01); *H05K 2201/10083* (2013.01)

(58) Field of Classification Search
CPC ............... H05K 1/0277–028; H05K 2201/056
See application file for complete search history.

(56) References Cited

U.S. PATENT DOCUMENTS

| | | | |
|---|---|---|---|
| 5,006,496 A | 4/1991 | Hans-Fr Schmidt | |
| 5,008,496 A * | 4/1991 | Schmidt | H05K 1/0278 174/254 |
| 5,265,322 A * | 11/1993 | Fisher | H05K 1/028 29/832 |
| 5,434,362 A * | 7/1995 | Klosowiak | H05K 1/028 174/254 |
| 5,998,738 A * | 12/1999 | Li | H05K 1/028 174/250 |

(Continued)

FOREIGN PATENT DOCUMENTS

| | | |
|---|---|---|
| CN | 101151943 A | 3/2008 |
| CN | 102458037 A | 5/2012 |

OTHER PUBLICATIONS

Combined First Chinese Office Action dated Jan. 5, 2021 and Search Report dated Dec. 27, 2020 corresponding to Chinese Application No. 2018113605689.

*Primary Examiner* — Hoa C Nguyen
(74) *Attorney, Agent, or Firm* — Dickinson Wright PLLC

(57) ABSTRACT

According to one or more embodiments described herein, an electronic power steering system includes a motor, and a semi-flexible ridged printed circuit board (PCB) assembly that is coupled with the motor. The semi-flexible ridged PCB assembly includes a first portion, a second portion, and a bendable member that couples the first portion and the second portion. The first portion is bendable with respect to the second portion using the bendable member.

17 Claims, 8 Drawing Sheets

(56) References Cited

U.S. PATENT DOCUMENTS

| | | |
|---|---|---|
| 2003/0042066 A1* | 3/2003 | Achenbach .......... B62D 5/0406 |
| | | 180/446 |
| 2004/0172820 A1* | 9/2004 | Lopez .................... H05K 1/028 |
| | | 29/847 |
| 2008/0093110 A1 | 4/2008 | Bagung |
| 2008/0110020 A1* | 5/2008 | Heisen .................. H05K 1/028 |
| | | 29/847 |
| 2010/0049403 A1 | 2/2010 | Gillman et al. |
| 2018/0224716 A1* | 8/2018 | Joo ........................ G03B 17/02 |
| 2018/0332722 A1* | 11/2018 | Ryou ...................... H05K 1/02 |

* cited by examiner

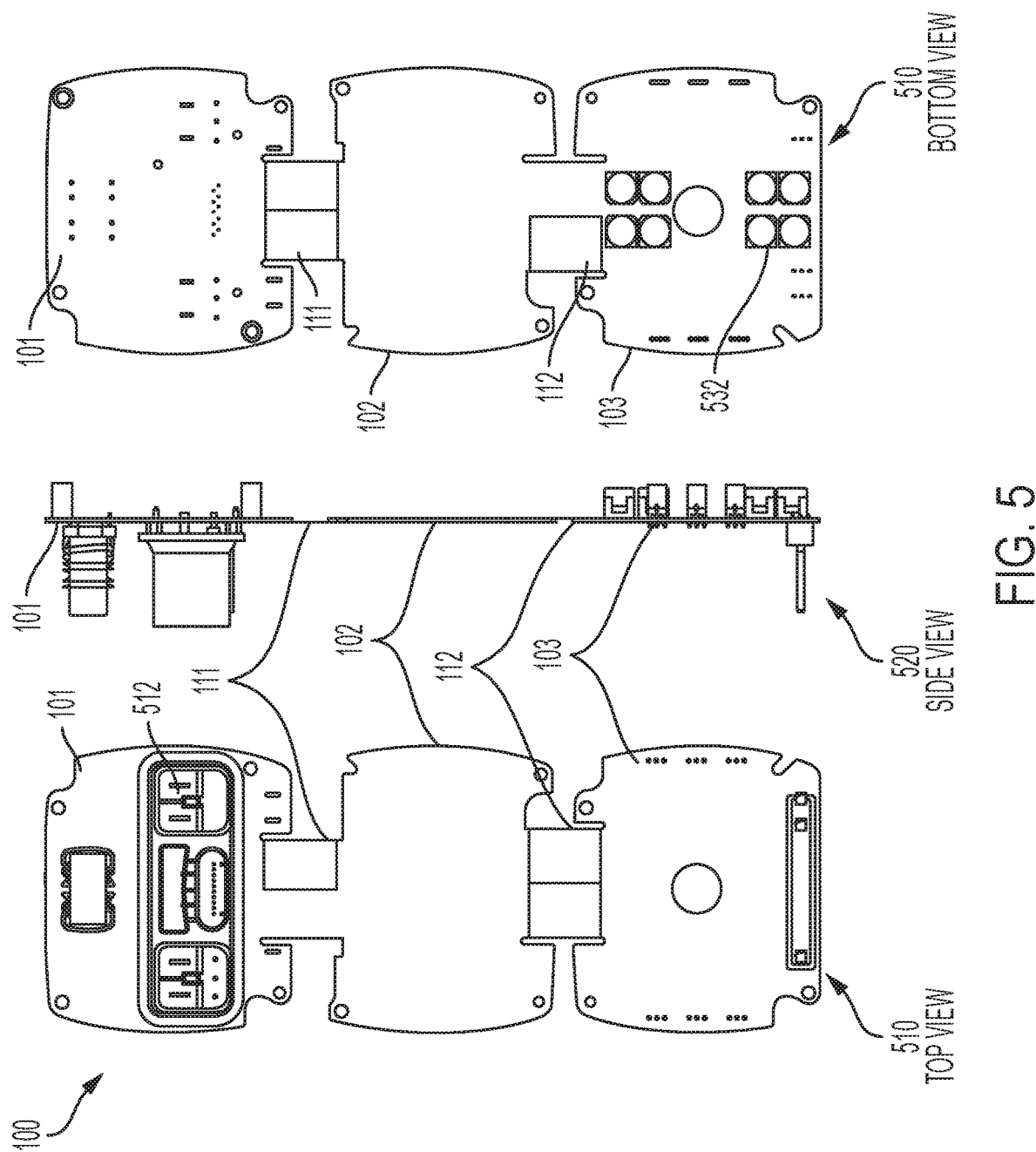

SEMI-FLEXIBLE RIDGED PRINTED CIRCUIT BOARD ASSEMBLY

CROSS-REFERENCES TO RELATED APPLICATIONS

This patent application claims priority to U.S. Provisional Patent Application Ser. No. 62/586,470, filed Nov. 15, 2017, which is incorporated herein by reference in its entirety.

BACKGROUND

A vehicle often includes an electric power steering (EPS) system to aid an operator of the vehicle in steering the vehicle. The EPS system uses sensors to detect a position and torque of a steering column and supply a signal to an electric motor to cause the electric motor to supply additional torque to assist the operator in steering the vehicle. The additional torque supplied to assist the operator in steering the vehicle can vary based on vehicle characteristics, driving conditions, road conditions, and the like.

The EPS system can utilize a controller to receive signals from sensors, analyze the signals, and control the electric motor. It is desirable to reduce the overall physical package size of the controller within the EPS system.

SUMMARY

According to one or more embodiments described herein, an electronic power steering system includes a motor, and a semi-flexible ridged printed circuit board (PCB) assembly that is coupled with the motor. The semi-flexible ridged PCB assembly includes a first portion, a second portion, and a bendable member that couples the first portion and the second portion. The first portion is bendable with respect to the second portion using the bendable member.

According to one or more embodiments, a semi-flexible ridged printed circuit board includes a first portion, a second portion, and a bendable member that couples the first portion and the second portion. The first portion is bendable with respect to the second portion using the bendable member.

According to one or more embodiments, a system includes a motor, and motor control system that includes a semi-flexible ridged printed circuit board, which in turn includes one or more electronic circuits to control operation of the motor. The semi-flexible ridged printed circuit board includes a first portion comprising connector circuits for coupling the semi-flexible ridged printed circuit board with the motor. The semi-flexible ridged printed circuit board further includes a second portion comprising one or more controllers for operating the motor. The semi-flexible ridged printed circuit board includes a bendable member that couples the first portion and the second portion, the first portion being bendable with respect to the second portion using the bendable member.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 5 depicts a block diagram of the PCB assembly according to one or more embodiments.

DETAILED DESCRIPTION

As used herein the terms module and sub-module refer to one or more processing circuits such as an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the sub-modules described below can be combined and/or further partitioned.

It should be noted that technical solutions are described herein with reference to specific embodiments, with references to one or more figures without limiting the same, and it is to be understood that the disclosed embodiments are merely illustrative of the technical solutions that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

The present application generally relates to electric circuits, and particularly to a semi-flexible ridged printed circuit board (PCB) assembly used in a motor control system. In one or more examples, the motor control system is part of an EPS system, where limiting the size of the motor control system is desirable.

Figure 1:
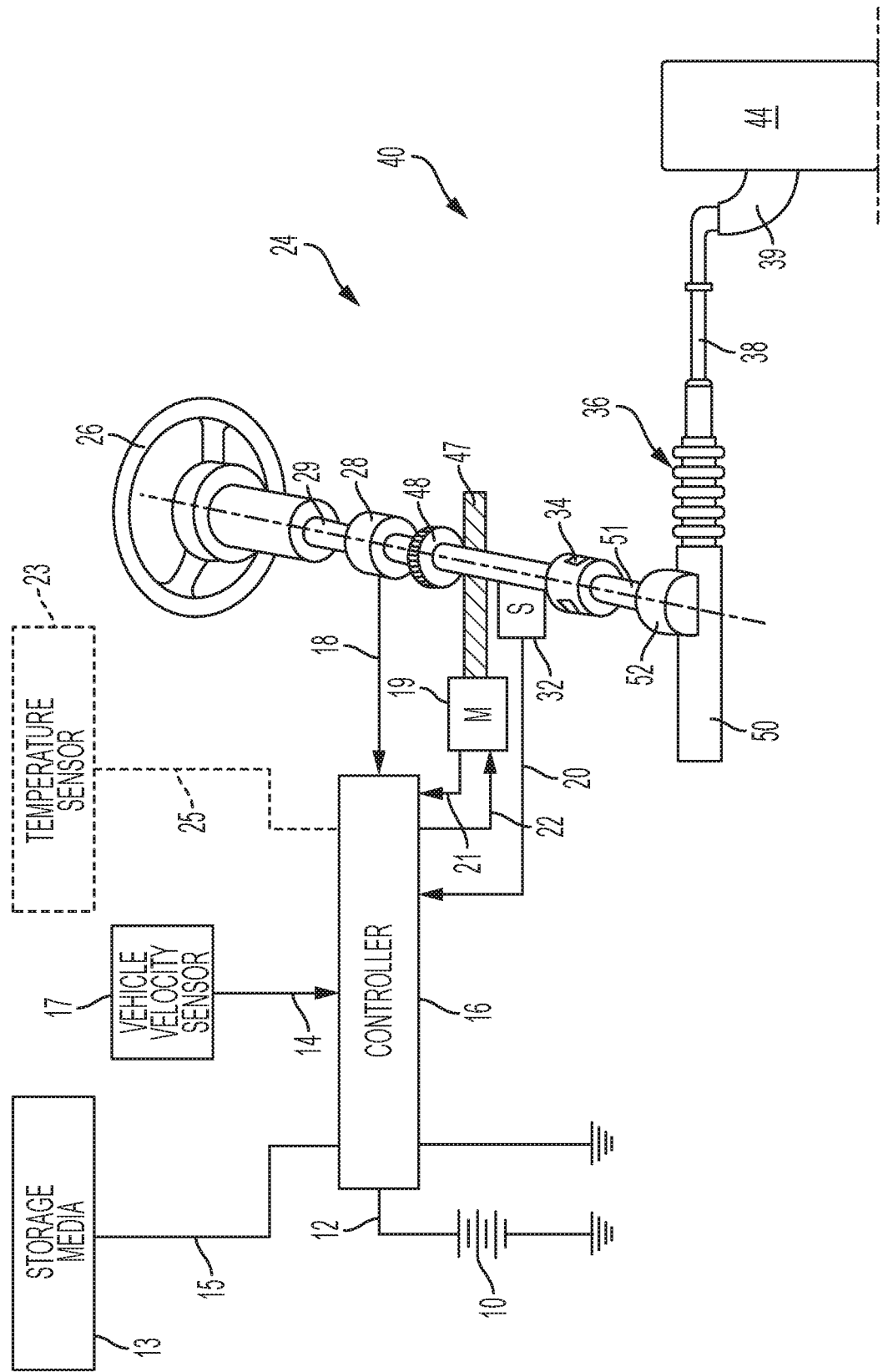
FIG. 1 is an exemplary embodiment of an electric power steering system.

Referring now to the Figures, where the technical solutions will be described with reference to specific embodiments, without limiting same, FIG. 1 is an exemplary embodiment of an electric power steering system (EPS) 40 suitable for implementation of the disclosed embodiments. The steering mechanism 36 is a rack-and-pinion type system and includes a toothed rack (not shown) within housing 50 and a pinion gear (also not shown) located under gear housing 52. As the operator input, hereinafter denoted as a steering wheel 26 (e.g. a hand wheel and the like) is turned, the upper steering shaft 29 turns and the lower steering shaft 51, connected to the upper steering shaft 29 through universal joint 34, turns the pinion gear. Rotation of the pinion gear moves the rack, which moves tie rods 38 (only one shown) in turn moving the steering knuckles 39 (only one shown), which turn a steerable wheel(s) 44 (only one shown).

Electric power steering assist is provided through the control apparatus generally designated by reference numeral 24 and includes the controller 16 and an electric machine 46, which could be a permanent magnet synchronous motor, a permanent magnet direct current motor, a switched reluctance motor, or any other type of motor, are is hereinafter denoted as motor 46. The controller 16 is powered by the vehicle power supply 10 through line 12. The controller 16 receives a vehicle speed signal 14 representative of the vehicle velocity from a vehicle velocity sensor 17. Steering angle is measured through position sensor 32, which may be an optical encoding type sensor, variable resistance type sensor, or any other suitable type of position sensor, and supplies to the controller 16 a position signal 20. Motor velocity may be measured with a tachometer, or any other device, and transmitted to controller 16 as a motor velocity signal 21. A motor velocity denoted $\omega_m$ may be measured, calculated or a combination thereof. For example, the motor velocity $\omega_m$ be calculated as the change of the motor position $\theta$ as measured by a position sensor 32 over a prescribed time interval. For example, motor speed $\omega_m$ be determined as the derivative of the motor position $\theta$ from the equation $\omega_m = \Delta\theta/\Delta t$ where $\Delta t$ is the sampling time and $\Delta\theta$ is the change in position during the sampling interval. Alternatively, motor velocity may be derived from motor position as the time rate of change of position. It will be appreciated that there are numerous well-known methodologies for performing the function of a derivative.

As the steering wheel 26 is turned, torque sensor 28 senses the torque applied to the steering wheel 26 by the vehicle operator. The torque sensor 28 may include a torsion bar (not shown) and a variable resistive-type sensor (also not shown), which outputs a variable torque signal 18 to controller 16 in relation to the amount of twist on the torsion bar. Although this is one type of torque sensor, any other suitable torque-sensing device used with known signal processing techniques will suffice. In response to the various inputs, the controller sends a command 22 to the electric motor 46, which supplies torque assist to the steering system through worm 47 and worm gear 48, providing torque assist to the vehicle steering.

It should be noted that although the disclosed embodiments are described by way of reference to motor control for electric steering applications, it will be appreciated that such references are illustrative only and the disclosed embodiments may be applied to any motor control application employing an electric motor, e.g., steering, valve control, and the like. Moreover, the references and descriptions herein may apply to many forms of parameter sensors, including, but not limited to torque, position, speed and the like. It should also be noted that reference herein to electric machines including, but not limited to, motors, hereafter, for brevity and simplicity, reference will be made to motors only without limitation.

In the control system 24 as depicted, the controller 16 utilizes the torque, position, and speed, and like, to compute a command(s) to deliver the required output power. Controller 16 is disposed in communication with the various systems and sensors of the motor control system. Controller 16 receives signals from each of the system sensors, quantifies the received information, and provides an output command signal(s) in response thereto, in this instance, for example, to the motor 46. Controller 16 is configured to develop the necessary voltage(s) out of inverter (not shown), which may optionally be incorporated with controller 16 and will be referred to herein as controller 16, such that, when applied to the motor 46, the desired torque or position is generated. Because these voltages are related to the position and speed of the motor 46 and the desired torque, the position and/or speed of the rotor and the torque applied by an operator are determined. A position encoder is connected to the steering shaft 51 to detect the angular position $\theta$. The encoder may sense the rotary position based on optical detection, magnetic field variations, or other methodologies. Typical position sensors include potentiometers, resolvers, synchros, encoders, and the like, as well as combinations comprising at least one of the forgoing. The position encoder outputs a position signal 20 indicating the angular position of the steering shaft 51 and thereby, that of the motor 46.

Desired torque may be determined by one or more torque sensors 28 transmitting torque signals 18 indicative of an applied torque. One or more exemplary embodiments include such a torque sensor 28 and the torque signal(s) 18 therefrom, as may be responsive to a compliant torsion bar, T-bar, spring, or similar apparatus (not shown) configured to provide a response indicative of the torque applied.

In one or more examples, a temperature sensor(s) 23 located at the electric machine 46. Preferably, the temperature sensor 23 is configured to directly measure the temperature of the sensing portion of the motor 46. The temperature sensor 23 transmits a temperature signal 25 to the controller 16 to facilitate the processing prescribed herein and compensation. Typical temperature sensors include thermocouples, thermistors, thermostats, and the like, as well as combinations comprising at least one of the foregoing sensors, which when appropriately placed provide a calibratable signal proportional to the particular temperature.

The position signal 20, velocity signal 21, and a torque signal(s) 18 among others, are applied to the controller 16. The controller 16 processes all input signals to generate values corresponding to each of the signals resulting in a rotor position value, a motor speed value, and a torque value being available for the processing in the algorithms as prescribed herein. Measurement signals, such as the above mentioned are also commonly linearized, compensated, and filtered as desired to enhance the characteristics or eliminate undesirable characteristics of the acquired signal. For example, the signals may be linearized to improve processing speed, or to address a large dynamic range of the signal. In addition, frequency or time based compensation and filtering may be employed to eliminate noise or avoid undesirable spectral characteristics.

In order to perform the prescribed functions and desired processing, as well as the computations therefore (e.g., the identification of machine parameters, control algorithm(s), and the like), controller 16 may include, but not be limited to, a processor(s), computer(s), DSP(s), memory, storage, register(s), timing, interrupt(s), communication interface(s), and input/output signal interfaces, and the like, as well as combinations comprising at least one of the foregoing. For example, controller 16 may include input signal processing and filtering to enable accurate sampling and conversion or acquisitions of such signals from communications interfaces. Additional features of controller 16 and certain processes therein are thoroughly discussed at a later point herein.

The present techniques describe a semi-flexible ridged printed circuit board (PCB) assembly in a high current EPS system, such as the EPS system 40. Bending a ridged PCB assembly in locally controlled areas enables one PCB to be used within a smaller package environment than would otherwise be possible. Typically, a total PCB assembly packaging area is substantially similar in size to the cross-sectional area of the motor 46 in the EPS system 40. For example, the width of the PCB assembly in a bent state is similar to the diameter of the motor 46. Accordingly, described herein are embodiments of EPS systems 40 that use a semi-flexible ridged PCB by bending two or more layers of copper, such as 180°. It should be appreciated that other angles can be achieved without departing from the present disclosure. In one or more examples, bending of the PCB is achieved by precision depth controlled milling of copper on the PCB assembly and by pre-impregnation in local areas of the PCB assembly, among other techniques. One of the advantages of using the semi-flexible ridged PCB is that the number of interconnects required between boards is reduced.

The bending, such as 180° bending, of the copper layers facilitates the PCB assembly to be packaged within an area substantially similar to the diameter (or cross-sectional dimension) of the motor 46 in the EPS system 40. For example, the area can be slightly larger than the diameter of the motor 46. Bending two copper layers facilitates signal and power/ground lines to connect throughout the controller 16 without using interconnects, thereby reducing cost and improving quality. Bending the PCB in two different directions enables proper distribution of the components while maintaining accessibility of connectors on one side (e.g. the top side) of the PCB and motor interfaces on another side (e.g. the bottom side). Further, according to one or more examples, the semi-flexible PCB is configured into separate circuits, such as to include multiple PCBs, each PCB being a flexible portion. For example, a PCB can be separated into three PCBs, one each for power board, logic board, and connector cord. Such a specific layout of the circuit assembly can further facilitate minimizing a number of interconnects.

Figure 2A:
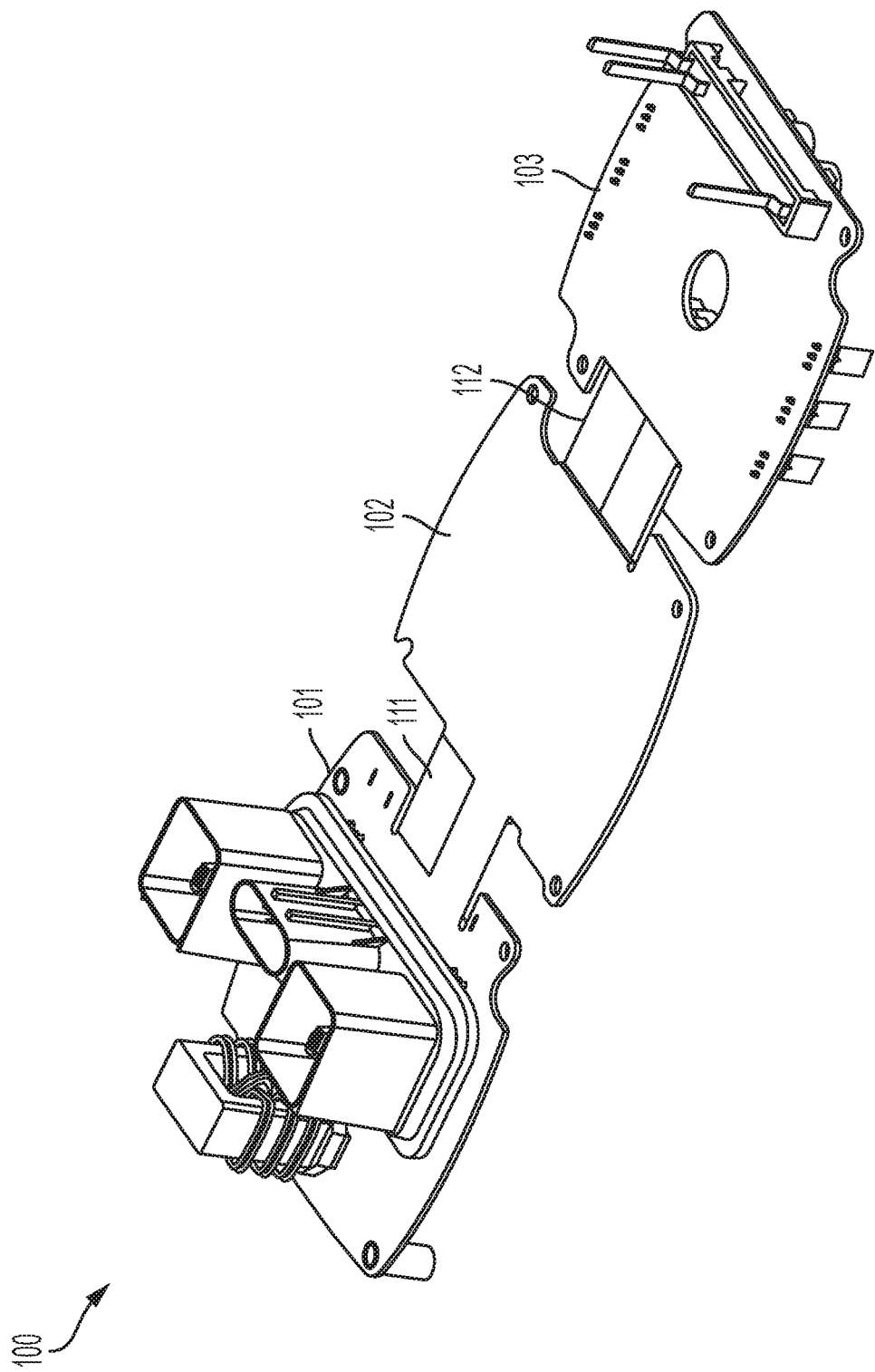
FIG. 2A depicts a semi-flexible ridged printed circuit board assembly according to aspects of the present disclosure.

FIG. 2A depicts a semi-flexible ridged printed circuit board (PCB) assembly 100 according to one or more embodiments. The PCB assembly 100 includes a first portion 101, a second portion 102, and a third portion 103. Each of the portions 101-103 can be a copper layer. A bending member 111 and 112 is disposed between each of the portions 101-103. For example, a first bending member 111 is disposed between the first portion 101 and the second portion 102, and a second bending member 112 is disposed between the third portion 103 and the second portion 102. The first portion 101 is bendable with respect to the second portion 102 at the first bending member 111, and the third portion 103 is bendable with respect to the second portion 102 at the second bending member 112.

The bendable members 111, 112 constitute a semi-rigid portion about which adjacent portions rotate or pivot. The bendable members 111, 112 can be facilitated by the use of a living hinge, plastic hinge or the like. Plastic hinge is a yielding zone in structural elements which generally develops at the point of Maximum Bending Moment, support, etc. For example, for a simply supported beam subjected to a point load, the plastic hinge will occur at the position of point load. In one or more examples, the bendable members 111, 112 are formed using RA (Rolled Annealed) copper. RA copper under mechanical loading exhibits deformation (ductility), facilitating its use for flexible and semi-rigid printed circuit boards. Alternatively, or in addition, the bendable members 111, 112 are formed using ED (Electrodeposited) copper. It is understood that in several embodiments, the bendable members 111, 112 can be formed using other techniques and material than the examples described herein.

Figure 2B:
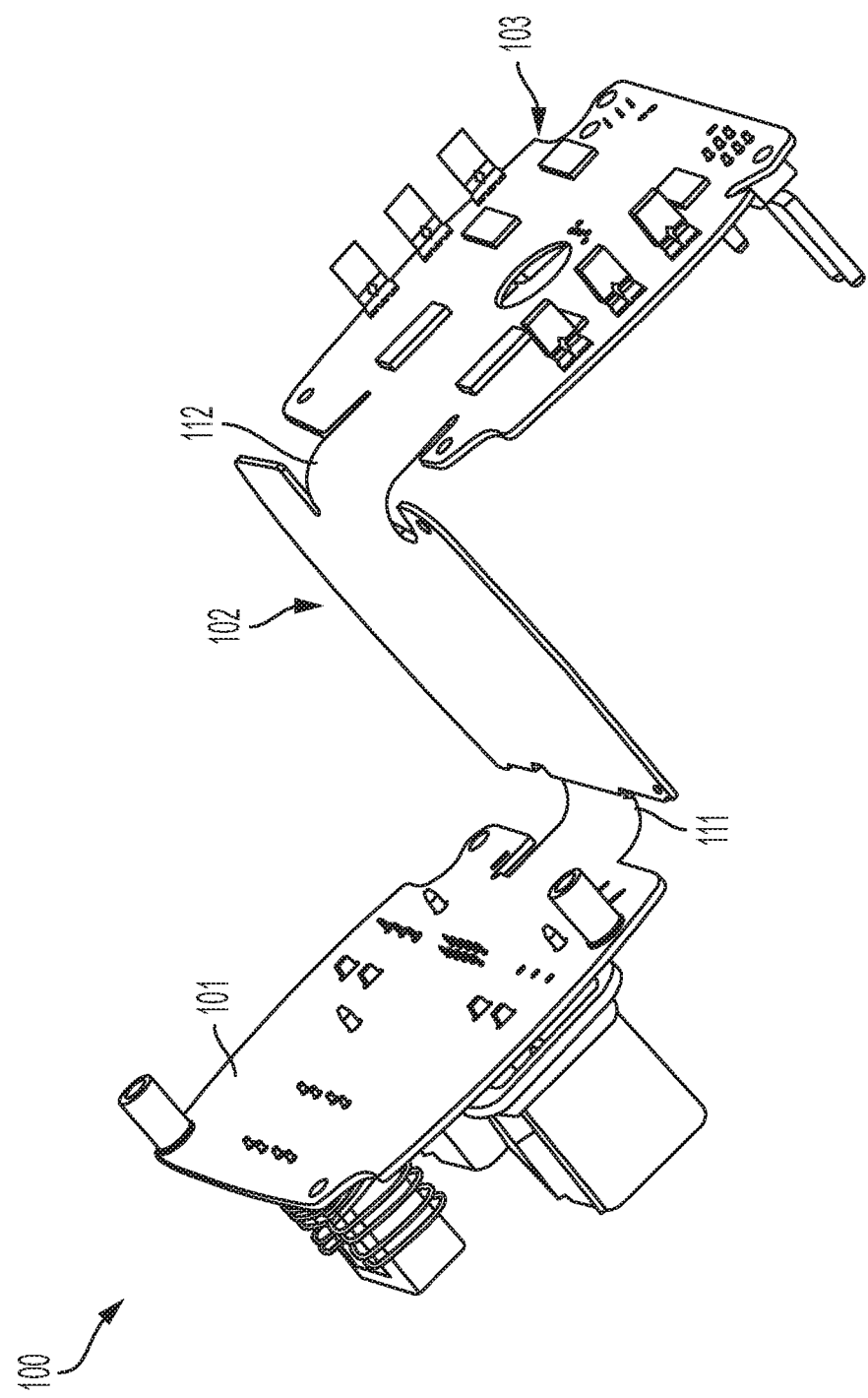
FIG. 2B depicts a semi-flexible ridged printed circuit board assembly according to aspects of the present disclosure.

FIG. 2B depicts another view of the semi-flexible ridged PCB assembly 100 according to one or more embodiments. In particular, FIG. 2B illustrates the third portion 103 bending with respect to the second portion 102 at the second bending member 112. Here, the third portion 103 is shown bent, approximately, to 90°.

Figure 2C:
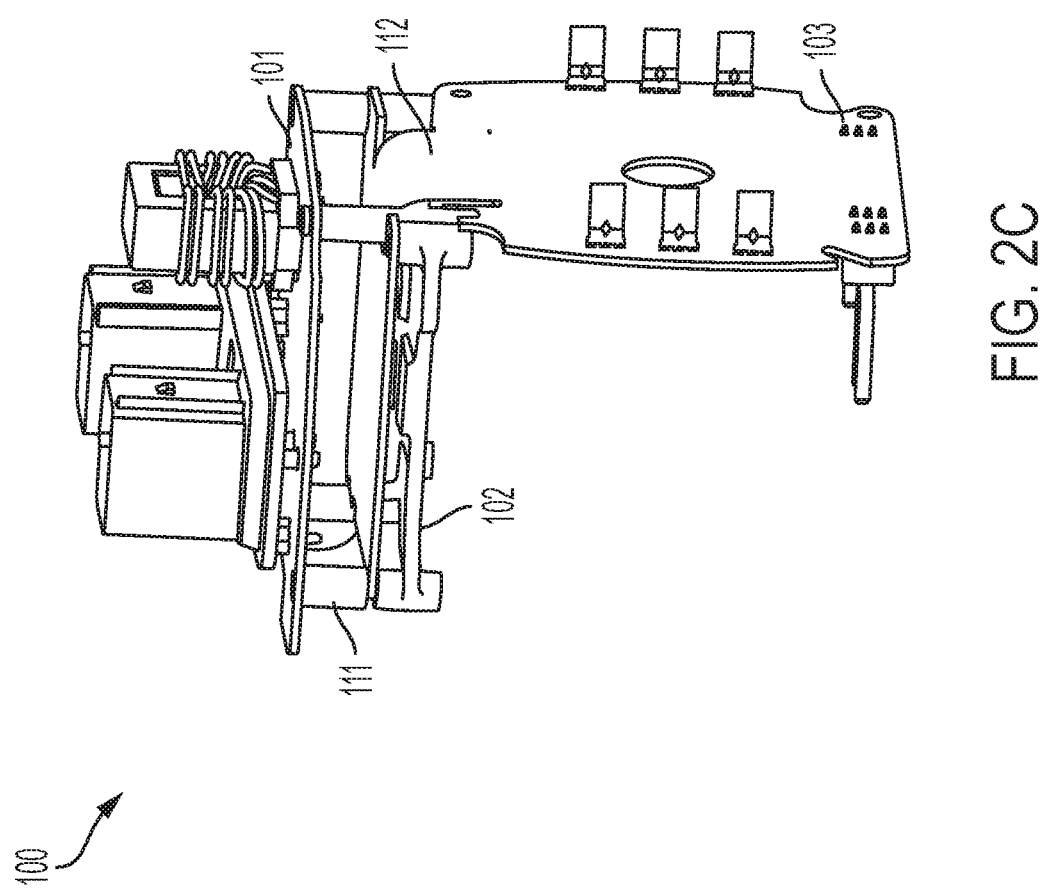
FIG. 2C depicts a semi-flexible ridged printed circuit board assembly according to aspects of the present disclosure.

FIG. 2C depicts another view of the semi-flexible ridged PCB assembly 100 according to one or more embodiments. In particular, FIG. 2C illustrates the third portion 103 having been bent to an approximately 180° angle with respect to the second portion 102 at the second bending member 112.

Figure 2D:
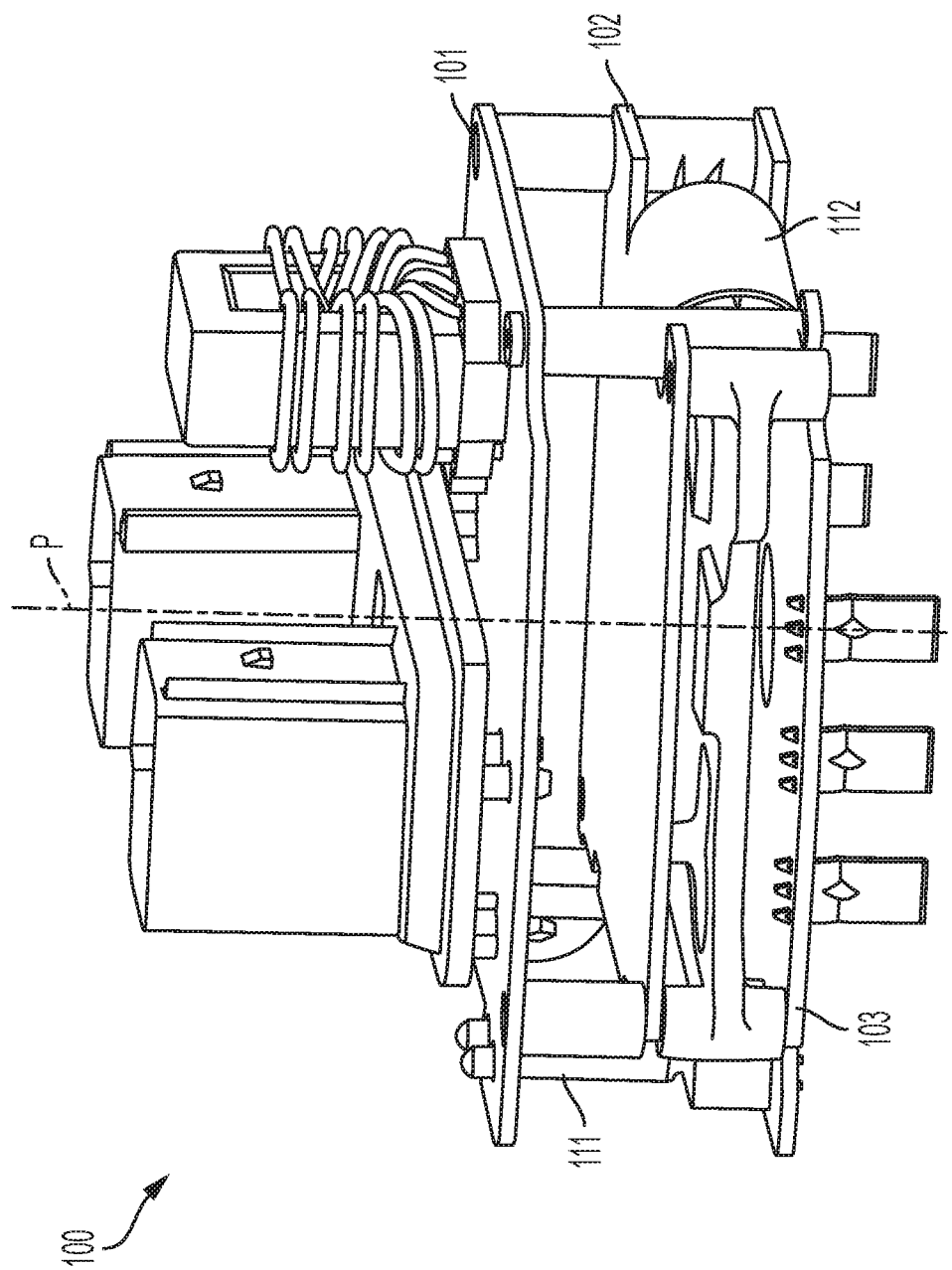
FIG. 2D depicts a semi-flexible ridged printed circuit board assembly according to aspects of the present disclosure.

FIG. 2D depicts another view of the semi-flexible ridged PCB assembly 100 according to one or more embodiments. In particular, FIG. 2D illustrates the first portion 101 having been bent to an approximately 180° angle with respect to the second portion 102 at the first bending member 111. In one or more examples, the first bending direction for the first portion 101 to be bent in relation to the second portion 102 using the first bending member 111 is opposite to a second bending direction for the third portion 103 to be bent in relation to the second portion 102 using the second bending member 112. For example, when the PCB assembly 100 is viewed along an axis P, the first bending member 111 facilitates bending the first portion 101 in a top-down direction, while the second bending member 112 facilitates bending the third portion 103 in a down-top direction.

As a result of the bending of the portions of the PCB assembly 100, the PCB assembly occupies less area in a bent state (e.g., FIG. 2D, 2C) than in an un-bent state (e.g., FIG. 2A).

Figure 3:
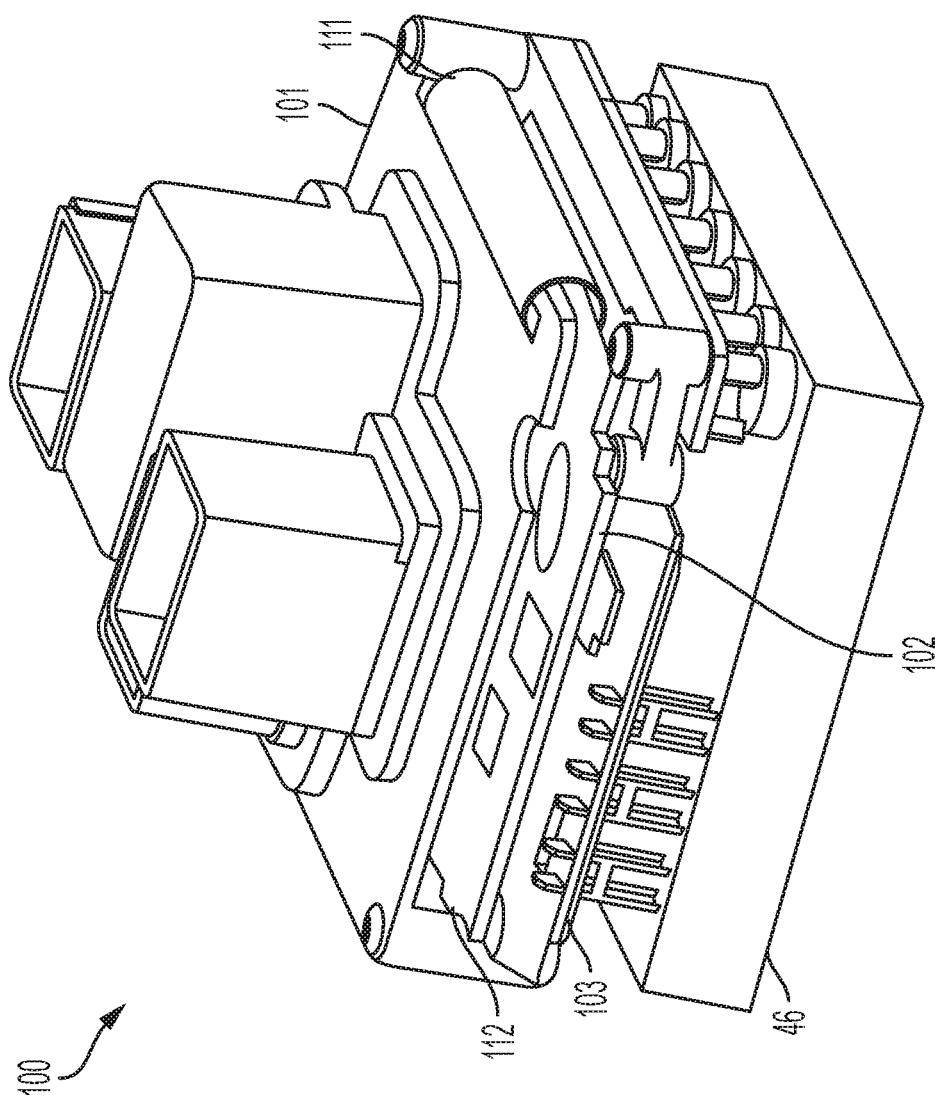
FIG. 3 depicts a semi-flexible ridged PCB assembly coupled to a motor according to one or more embodiments.

FIG. 3 depicts the semi-flexible ridged PCB assembly 100 coupled to the motor 46 according to one or more embodiments. Here, the PCB assembly 100 is in the bent state (e.g., FIG. 2D), and as can be seen the cross-sectional area of the PCB assembly 100, in the bent state, is similar to the cross-sectional area of the motor 46.

Figure 4:
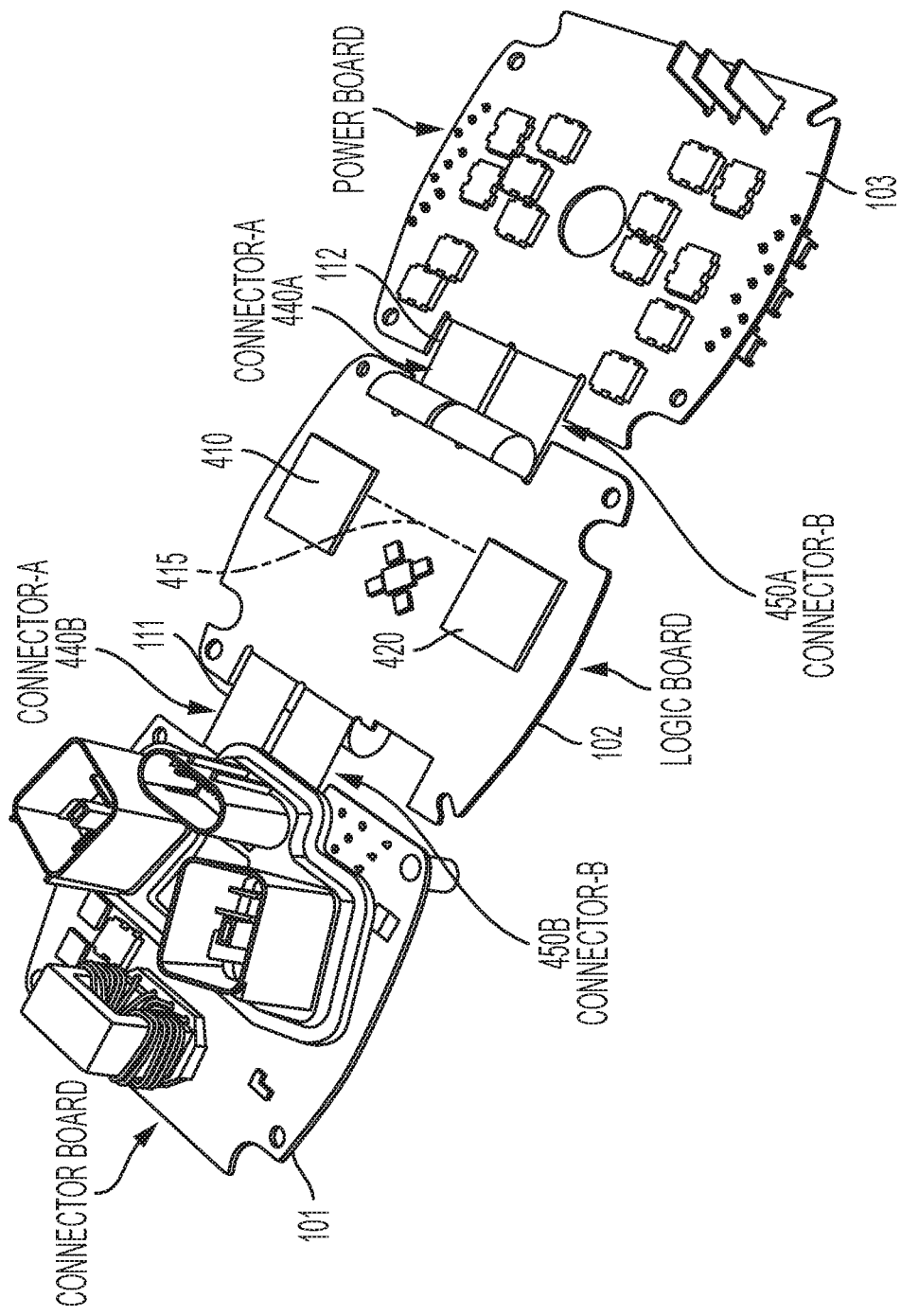
FIG. 4 depicts a semi-flexible ridged printed circuit board assembly according to aspects of the present disclosure.

FIG. 4 depicts a semi-flexible ridged PCB assembly 100 according to one or more embodiments. Here, the first portion 101, the second portion 102, and the third portion 103, are separated according to specific circuits. For example, the first portion 101 is a connector board that includes electronic circuits for coupling the PCB assembly 100 with the motor 46.

The second portion 102 is a logic board that includes one or more electronic circuits to perform control of the motor 46 that is coupled with the PCB assembly 100. In the particular case of the EPS 40, two electronic control units (ECU), an ECU-A 410 and an ECU-B 420, are used to provide redundancy. Specifically, the ECU-A 410 and the ECU-B 420 are both performing the same operations independently so that if any one of the two ECUs fail, results from the other ECU can be used continuously.

The third portion 103 is a power board that includes one or more electronic circuits to facilitate power supply to various circuits that are part of the PCB assembly 100 and/or the motor 46.

One or more electronic circuits from each portion 101-103 can be coupled with each other using connectors, such as wires, that are part of the portion itself. For example, the ECU-A 410 and the ECU-B 420 of the second portion 102 are coupled with each other using a connector 415 that is part of the second portion 102 itself.

Electronic circuits from different boards are coupled with each other using connectors 440, 450 that are part of the bending portions 111, 112. In one or more examples, the connectors 440, 450, are divided into two or more parts depending on the number of bending portions in the PCB assembly 100. For example, the first bending portion 111 includes a first part of connectors 440B that connect the ECU-A 410 with one or more circuits of the connector board (first portion 101); and the second bending portion 112 includes connectors 440A that connect the ECU-A 410 with one or more circuits of the power board (third portion 103). The first bending portion 111 further includes a first part of the connectors 450B, which are separate from the connectors 440B, and that connect the ECU-B 420 with one or more circuits of the connector board (first portion 101); and the second bending portion 112 includes the second part of the connectors 450B that connect the ECU-B 420 with one or more circuits of the power board (third portion 103). It should be noted that each of the bending portions 111, 112, includes the separate connectors respectively for each separate ECUs in the second portion 102 to facilitate the redundancy.

Accordingly, by using the bending portions 111, 112, facilitates the included connectors to provide signal and power/ground lines to connect through the ECUs 440 and 450 without using interconnects. This facilitates reducing cost and improving quality of the connections between the one or more electronic circuits.

FIG. 5 depicts a block diagram of the PCB assembly according to one or more embodiments. A top view 510, a side view 520, and a bottom view 530, are shown. Power supply connectors 512 to connect the PCB assembly 100 to a power source are shown on the first portion 101. Connectors 532 for the motor 46 shown in the bottom view in the third portion 103. It is understood that the portion used for the different types of electronic circuits can be changed in different embodiments.

The PCB assembly 100 is milled using material that has a particular concentration of copper that can facilitate milling the bendable members 111, 112 with precision depth control. Alternatively, the material used for the PCB assembly 100 can include any other material that can be milled with precision depth control. Typically, for high current applications, such as the EPS 40, higher concentration of copper (e.g. 50% or more) is used. However, such concentration of copper does not lend to precision depth milling, particularly for facilitating the bendable members 111, 112. Accordingly, the material used for the PCB assembly 100 uses a lower concentration of copper, which can facilitate the precision depth milling for the sections of the PCB assembly 100 that include the bendable members 111, 112 to be flexible to bend substantially 180°. The bending members 111, 112 are made bendable by milling the area of the bending members using precision controlled depth milling. The bendable members 111, 112 are further formed by pre-impregnation in local areas of the PCB assembly.

Accordingly, the PCB assembly 100 facilitates a semi-flexible ridged circuit board assembly that reduces the area occupied by the motor control circuit in the EPS 40. In one or more examples, the PCB assembly 100 facilitates two portions of the PCB assembly 100 to be bent by 180°, which allows the PCB assembly 100 to be folded and packaged within substantially the same diameter as the motor 46. Further, such bending of one or more portions of the PCB assembly 100 facilitates signal and power/ground lines to connect throughout one or more controllers without using interconnects.

Further yet, in one or more examples, bending the PCB assembly 100 in different directions facilitates distribution of the components of the PCB assembly in a manner that the accessibility of the connectors are maintained towards a single side of the folded PCB assembly, for example, on the top side, such that the motor 46 is interfaced (or coupled) on the other side of the folded PCB assembly 100, for example, on the bottom side.

Further, division of the one or more portions of the PCB assembly 100 into separate types of boards (e.g. power/logic/connector) facilitates minimizing the number of required interconnects among the various electronic circuits of the PCB assembly 100.

In one or more examples, the PCB assembly is milled using copper or any other such material that can be milled with precision depth control. The bending members are made bendable by milling the area of the bending members using precision depth milling.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An electronic power steering system comprising:
    a motor; and
        a semi-flexible ridged printed circuit board (PCB) assembly that is coupled with the motor, the semi-flexible ridged PCB assembly comprises:
        a first portion of rigid PCB material;
        a second portion of rigid PCB material;
        a bendable member of rigid PCB material with at least one milled portion, the at least one milled portion having a thickness less than a thickness of the first portion and the second portion, the bendable member couples the first portion and the second portion and spaces the first portion from the second portion, the first portion being bendable with respect to the second portion using the at least one milled portion of the bendable member;
        wherein the bendable member is formed at least partially of copper material and the bendable member is pre-impregnated; and
        wherein the milled portion is formed in the copper material by depth controlled milling of the bendable member that is pre-impregnated.

2. The electronic power steering system of claim 1, wherein the first portion is bendable by 180° to substantially overlap the second portion.

3. The electronic power steering system of claim 1, wherein bending the first portion reduces a cross-sectional dimension of the semi-flexible ridged PCB assembly to be substantially equal to a cross-sectional dimension of the motor.

4. The electronic power steering system of claim 2, wherein the bendable member is a first bendable member, and the semi-flexible ridged PCB assembly further comprises:
    a third portion; and
    a second bendable member that couples the third portion and the second portion and spaces the third portion from the second portion, the third portion being bendable with respect to the second portion using the second bendable member.

5. The electronic power steering system of claim 4, wherein the first portion is bendable with respect to the second portion in a first direction and wherein the third portion is bendable with respect to the second portion in a second direction.

6. The electronic power steering system of claim 5, wherein the third portion is bendable by 180° to substantially overlap the first portion and the second portion.

7. A semi-flexible ridged printed circuit board comprising:
a first portion of rigid PCB material;
a second portion of rigid PCB material;
a bendable member of rigid PCB material with at least one milled portion the at least one milled portion having a thickness less than a thickness of the first portion and the second portion, the bendable member couples the first portion and the second portion and spaces the first portion from the second portion, the first portion being bendable with respect to the second portion using the at least one milled portion of the bendable member;
wherein the bendable member is formed at least partially of copper material and the bendable member is pre-impregnated; and
wherein the milled portion is formed in the copper material by depth controlled milling of the bendable member that is pre-impregnated.

8. The semi-flexible ridged printed circuit board of claim 7, wherein the first portion is bendable by 180° to substantially overlap and be spaced from the second portion.

9. The semi-flexible ridged printed circuit board of claim 7, wherein the bendable member is a first bendable member, and the semi-flexible ridged printed circuit board further comprises:
a third portion; and
a second bendable member that couples the third portion and the second portion and spaces the third portion from the second portion, the third portion being bendable with respect to the second portion using the second bendable member.

10. The semi-flexible ridged printed circuit board of claim 9, wherein the first portion is bendable with respect to the second portion in a first direction and wherein the third portion is bendable with respect to the second portion in a second direction.

11. The semi-flexible ridged printed circuit board of claim 10, wherein the third portion is bendable by 180° to substantially overlap the first portion and the second portion.

12. A system comprising:
a motor; and
a motor control system comprising a semi-flexible ridged printed circuit board comprising one or more electronic circuits to control operation of the motor, the semi-flexible ridged printed circuit board comprising:
a first portion of rigid PCB material comprising connector circuits for coupling the semi-flexible ridged printed circuit board with the motor;
a second portion of rigid PCB material comprising one or more controllers for operating the motor;
a bendable member of rigid PCB material with at least one milled portion the at least one milled portion having a thickness less than a thickness of the first portion and the second portion, the bendable member couples the first portion and the second portion and spaces the first portion from the second portion, the first portion being bendable with respect to the second portion using the at least one milled portion of the bendable member;
wherein the bendable member is formed at least partially of copper material and the bendable member is pre-impregnated; and
wherein the milled portion is formed in the copper material by depth controlled milling of the bendable member that is pre-impregnated.

13. The system of claim 12, wherein the first portion is bendable by 180° to substantially overlap the second portion.

14. The system of claim 12, wherein the bendable member is a first bendable member, and the semi-flexible ridged printed circuit board further comprises:
a third portion; and
a second bendable member that couples the third portion and the second portion, the third portion being bendable with respect to the second portion using the second bendable member.

15. The system of claim 14, wherein the first portion is bendable with respect to the second portion in a first direction and wherein the third portion is bendable with respect to the second portion in a second direction.

16. The system of claim 15, wherein the third portion is bendable by 180° to substantially overlap the second portion.

17. The system of claim 12, wherein bending the first portion reduces a cross-sectional dimension of the semi-flexible ridged printed circuit board to be substantially equal to a cross-sectional dimension of the motor.

\* \* \* \* \*